US009490102B2

(12) United States Patent
Schmidt et al.

(10) Patent No.: US 9,490,102 B2
(45) Date of Patent: Nov. 8, 2016

(54) DEVICE FOR GENERATING PLASMA HAVING A HIGH RANGE ALONG AN AXIS BY ELECTRON CYCLOTRON RESONANCE (ECR) FROM A GASEOUS MEDIUM

(71) Applicant: H.E.F., Andrezieux Boutheon (FR)

(72) Inventors: Beat Schmidt, Montrond les Bains (FR); Christophe Heau, Saint Etienne (FR); Philippe Maurin-Perrier, St Marcellin en Forez (FR)

(73) Assignee: H.E.F., Andrezieux Boutheon (FR)

( * ) Notice: Subject to any disclaimer, the term of this patent is extended or adjusted under 35 U.S.C. 154(b) by 49 days.

(21) Appl. No.: 14/425,409

(22) PCT Filed: Sep. 4, 2013

(86) PCT No.: PCT/FR2013/052035
§ 371 (c)(1),
(2) Date: Mar. 3, 2015

(87) PCT Pub. No.: WO2014/041280
PCT Pub. Date: Mar. 20, 2014

(65) Prior Publication Data
US 2015/0214008 A1    Jul. 30, 2015

(30) Foreign Application Priority Data

Sep. 11, 2012 (FR) ...................... 12 58495

(51) Int. Cl.
*H01J 37/32* (2006.01)
*H05H 1/46* (2006.01)
(52) U.S. Cl.
CPC .... *H01J 37/32009* (2013.01); *H01J 37/32192* (2013.01); *H01J 37/32678* (2013.01); *H05H 1/46* (2013.01); *H05H 2001/463* (2013.01)

(58) Field of Classification Search
CPC .................................. H01J 37/32009
USPC ...................................... 315/111.21
See application file for complete search history.

(56) References Cited

U.S. PATENT DOCUMENTS 4,610,770 A * 9/1986 Saito ...................... C23C 14/34
204/192.1
4,745,337 A  5/1988 Pichot et al.
(Continued)

FOREIGN PATENT DOCUMENTS

DE    4136297 A1   5/1993
DE    19812558 A1   9/1999
(Continued)

OTHER PUBLICATIONS

International Search Report for PCT/FR2013/052035 dated Nov. 7, 2013.

*Primary Examiner* — Douglas W Owens
*Assistant Examiner* — Srinivas Sathiraju
(74) *Attorney, Agent, or Firm* — Heslin Rothenberg Farley & Mesiti P.C.

(57) ABSTRACT

The device includes at least two coaxial waveguides each formed of a central conductor and of an external conductor to bring microwaves into a treatment chamber. The at least two electromagnetic wave injection guides are combined with a magnetic circuit elongated in one direction. The magnetic circuit surrounding the waveguides by creating a magnetic field capable of achieving an ECR condition close to the waveguides.

9 Claims, 5 Drawing Sheets

(56) References Cited

U.S. PATENT DOCUMENTS

| | | | | |
|---|---|---|---|---|
| 4,883,968 A | * | 11/1989 | Hipple | H01J 27/18 250/423 R |
| 5,446,137 A | * | 8/1995 | Maag | C07H 21/00 536/23.1 |
| 5,587,205 A | * | 12/1996 | Saito | C23C 16/511 118/723 MA |
| 5,961,773 A | * | 10/1999 | Ichimura | H01J 37/32082 118/723 MA |
| 8,728,588 B2 | * | 5/2014 | Schmidt | H01J 37/32678 427/248.1 |
| 2001/0026575 A1 | * | 10/2001 | Sato | H05B 7/00 373/18 |
| 2010/0074807 A1 | * | 3/2010 | Bulkin | H01J 37/32192 422/186.03 |
| 2010/0219160 A1 | * | 9/2010 | Schmidt | H01J 37/32678 216/67 |

FOREIGN PATENT DOCUMENTS

| | | |
|---|---|---|
| EP | 1075168 A1 | 2/2001 |
| EP | 1976346 A1 | 10/2008 |
| WO | 2005027595 A2 | 3/2005 |
| WO | 2008009558 A1 | 1/2008 |
| WO | 2008017304 A2 | 2/2008 |

* cited by examiner

PRIOR ART

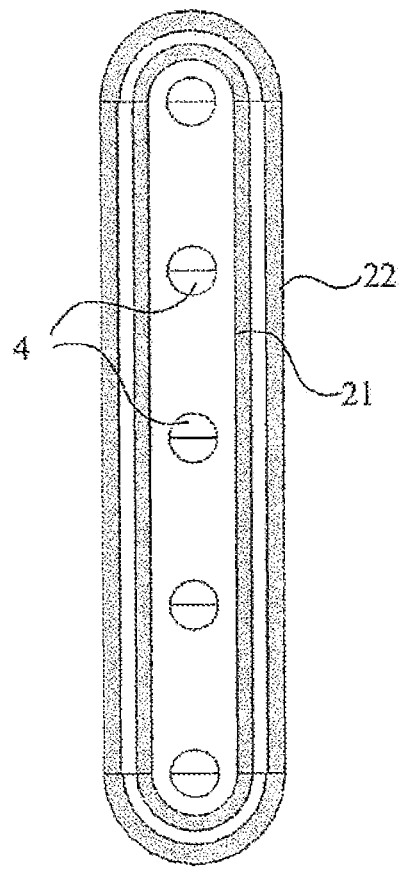
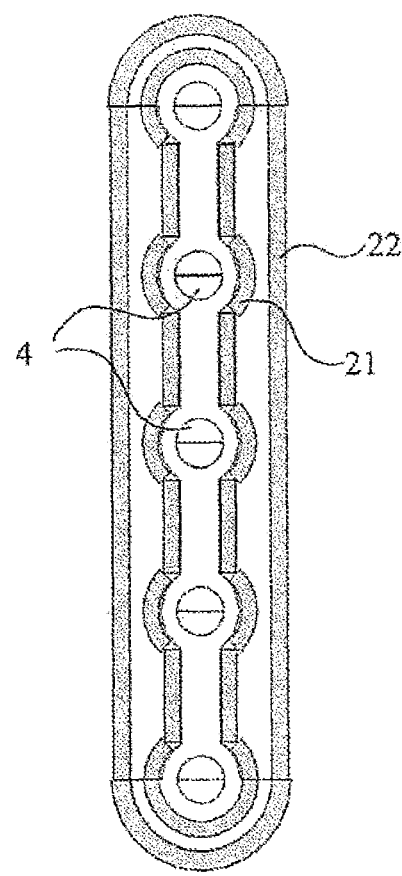
FIG. 5A  FIG. 5B
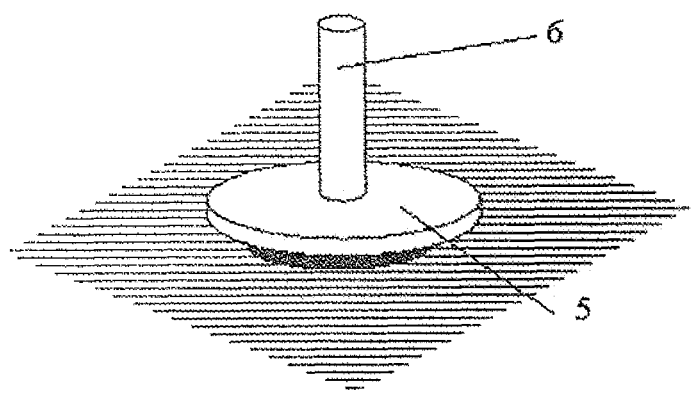
FIG. 6

DEVICE FOR GENERATING PLASMA HAVING A HIGH RANGE ALONG AN AXIS BY ELECTRON CYCLOTRON RESONANCE (ECR) FROM A GASEOUS MEDIUM

CROSS REFERENCE TO RELATED APPLICATIONS

This application is the U.S. National Filing of PCT Application No. PCT/FR2013/052035 filed on Sep. 4, 2013 and published in French as WO 2014/041280 A1 on Mar. 20, 2014, and claims priority of French patent application number 1258495 filed on Sep. 11, 2012, the entire disclosure of these applications being hereby incorporated herein by reference.

BACKGROUND ART

The invention relates to the technical field of plasma generation by electron cyclotron resonance (ECR) from a gaseous medium, and more specifically relates to the field of vacuum surface treatments.

As perfectly well known by those skilled in the art, electron cyclotron resonance occurs when an electromagnetic wave and a static magnetic field sufficiently strong for the frequency of the cyclotronic motion of electrons around the magnetic field lines to be equal to the wave frequency are applied at the same time. Thus, electrons can absorb the wave energy to then transmit it to the gas in order to form a plasma. The plasma generated by electron cyclotron resonance may be used in the surface treatment of parts, metallic or not, such as the cleaning of parts by ion etching, the ion assistance to a PVD method, the activation of gas species to form PACVD coatings . . . . Such plasma treatment methods may be used, among others, in mechanics, optics, corrosion protection or surface treatment for the production of energy.

According to the state of the art, many plasma treatments require a source having a plasma with a large extension along an axis. A way to create an extended plasma is to juxtapose several sources of small dimensions. This is for example described in patent EP 1075168 where the plasma is created by juxtaposing several dipolar ECR sources, thus creating a multi-dipolar structure. The configuration described in this patent is illustrated in FIG. 1. Electron cyclotron resonance (ECR) at microwave frequencies is a technology well adapted to such multiple sources since the power distribution can be performed quite easily. It is however difficult, with such a simple juxtaposition of sources, to obtain a very good deposition uniformity. Further, the dipolar structure of such sources does not enable to direct the plasma towards the substrates to be treated, thus generating significant plasma losses towards the walls. Such losses correspond to power losses, which are limiting for the deposition speed.

Other ECR sources have magnetic configurations which decrease losses by directing the plasma more towards the substrates to be treated. This is for example the case for the source described in patent WO 2008/017304 (FIG. 2). As specified in this patent, several of these sources placed side-by-side allow a treatment across a width exceeding the size of a single source. However, such a configuration will not provide a good treatment uniformity, there will necessarily be a drop in the plasma density where the sources touch, due to the magnetic interaction between sources.

There exist other ECR plasma sources having a significant intrinsic extension in one direction. Such sources are described in patents DE 4136297, DE 19812558, and WO 2005/027595. The common point of these sources is that the actual plasma forms a portion of the external conductor of a coaxial structure or of a hollow waveguide. FIG. 3, which corresponds to the prior art of patent DE 19812558, representatively shows the structure of such a source. The source of patent DE 4136297 comprises a hollow cylinder made of a dielectric material which separates the inside of the waveguide from the plasma. The disadvantage of this element is that any conductive deposit on its surface will prevent the forming of the plasma. For example, such a source cannot be used for the stripping of metal parts since the metal vapor due to the stripping would pollute the dielectric. Although the sources of patents DE 19812558 and WO 2005/027595 are potentially less sensitive to such a contamination, they do not optimize the plasma flow towards the parts to be treated either.

The invention aims at overcoming these disadvantages in a simple, sure, efficient, and rational way.

The problem that the present invention aims at solving thus is to provide a linear plasma source having a good uniformity, which directs the plasma towards the substrates to be treated, thus decreasing losses toward the walls, and which may be made insensitive to any conductive deposit forming at its surface.

BRIEF SUMMARY OF THE INVENTION

To solve such a problem, a device for generating a plasma by electron cyclotron resonance ECR from a gaseous medium and comprising at least two coaxial waveguides formed of a central conductor and of an external conductor for bringing microwaves into a treatment chamber, characterized in that at least the two electromagnetic wave injection guides are combined with a magnetic circuit elongated in one direction, said magnetic circuit surrounding the waveguides by creating a magnetic field capable of achieving an ECR condition close to said waveguides, has been designed and developed. Proximity means that the ECR area should be as close as possible to the antenna, without for the magnetic field line crossing the ECR area to be mainly intercepted by the antenna of an injector.

There appears from these characteristics that the fact that the injection of electromagnetic waves is point-shaped is smoothed by the electron drift (symbolized by an arrow (50) in FIG. 4) in the field of the magnetic system (20) which surrounds the injectors (4), recalling that an injector (4) is formed of a coaxial waveguide (1)-(2) and of an antenna (5-6 or 7). Drift designates the slow motion of electrons perpendicular to the field lines (40). Such a motion is due to the gradient and to the curvature of these lines. Indeed, the space between two injectors receives, by drift, hot electrons originating from the resonance areas of two injectors. As they drift, electrons lose their energy by creating ions. The ionization rate decreases as the distance from the injector increases, but the two opposite drifts add to each other, whereby the intensity of the source varies little according to the position along its longer side.

To solve the posed problem of forming a magnetic trap for electrons in order to limit losses thereof, the magnetic circuit has, close to the waveguides, two poles of opposite polarities. The first pole forms a first line surrounding the waveguide(s), while the second pole forms a second line, surrounding said first line.

It should be reminded according to the invention that wave injectors are formed by coaxial guides having their central conductor ending in an antenna. Now, it is not obvious to those skilled in the art that such a system can function since a magnetic circuit elongated in one direction, such as claimed, does not enable the ECR area to surround the injection point, as is, for example, the case for the source of previously-mentioned patent WO 2008/017304. Indeed, the energy transfer to the plasma becomes more difficult since, first, the volume of the ECR close to the injectors is smaller and, second, the environment of the antenna is not homogeneous: the wave passes from a guide having a symmetry of revolution into a medium (plasma) which does not have this symmetry, and the wave is thus partially reflected. This second point is a problem especially because the system undergoes a transition when plasma ignites: before the plasma ignition, the medium (vacuum) is homogeneous, but it is no longer so afterwards. Such a transition creates an impedance change which is difficult to manage. Injectors are generally equipped with an impedance matching device, but such devices are usually manual and are not provided for a modification during the process.

For these different reasons, it has been necessary to develop different shapes of antennas specifically adapted to the device operation with an elongated magnetic system.

To achieve this, in a first embodiment, the central conductor has a concentric disk of larger diameter than the opening of the waveguide to protect the inside of said guide, which is positioned as closely as possible to the ECR area, and is topped with a rod arranged in coaxial alignment with the central conductor.

In a second embodiment, the central conductor is terminated by a plate elongated along the longest axis of the magnetic circuit, one of the ends at least of said plate being fitted to be placed in contact with the surface of the source in order to create a short-circuit, the width of the plate being larger than the waveguide opening.

The width of the plate is constant along its entire length, or the plate width decreases as the distance from the central conductor increases, and with respect to said at least one side of said conductor.

Based on the characteristics underlying the invention, the device is applicable in the case of a treatment chamber comprising a body with a cooling circuit, said body comprising a housing for the assembly of the elongated magnetic circuit formed of the first line of magnets according to the first polarization and the second line of magnets according to an opposite polarization and surrounding the first line, which surrounds the waveguides assembled in the holes formed across the thickness of the body, the first and second lines of magnets being connected on the side opposite to the plasma, by a ferromagnetic plate, the body and the magnetic system being separated from the plasma by an amagnetic shield.

Considering the different possible shapes of the antennas, in order to adapt them to the operation of the elongated magnetic system:
either the central conductor of each guide is a cylindrical rod centered with respect to the external conductor inserted into the body with a good electric contact, a dielectric window being placed inside of the guide under the opening which is covered with the disk topped with the rod to be used as an antenna.
or the central conductor of each guide is a cylindrical rod centered with respect to the external conductors inserted in the body by forming a good electric contact, a dielectric window being placed inside of the guide under the opening, which is covered with the elongated plate along the axis of the injectors, said elongation being asymmetrical with respect to the central conductor for a waveguide located at a rounded end of the magnetic circuit, the elongation being only in the direction of the opposite end, symmetrical with respect to the central conductor for a waveguide located in the linear portion of the magnetic circuit, each elongated portion being provided with the fitting used as a short-circuit.

BRIEF DESCRIPTION OF THE DRAWING FIGURES

The invention is discussed hereafter in further detail by means of the accompanying drawings, among which:

FIGS. 5A and 5B show possible embodiments of the magnetic structure, according to the invention.

FIG. 6 shows a first shape of antenna according to the present invention.

Figure 7A:
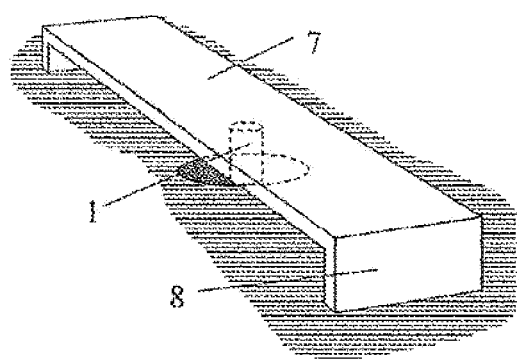
Figure 7B:
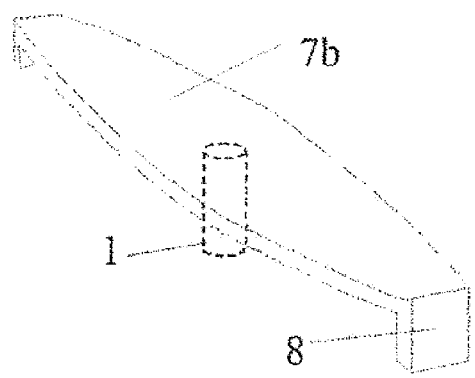
Figure 7C:
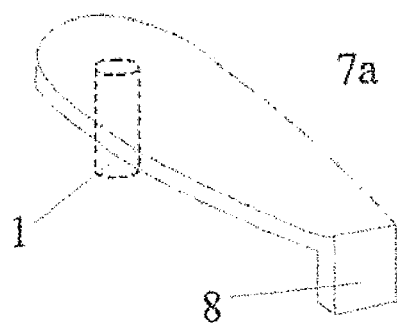

FIGS. 7A, 7B, and 7C show other shapes of antennas according to the invention.

Figure 8:
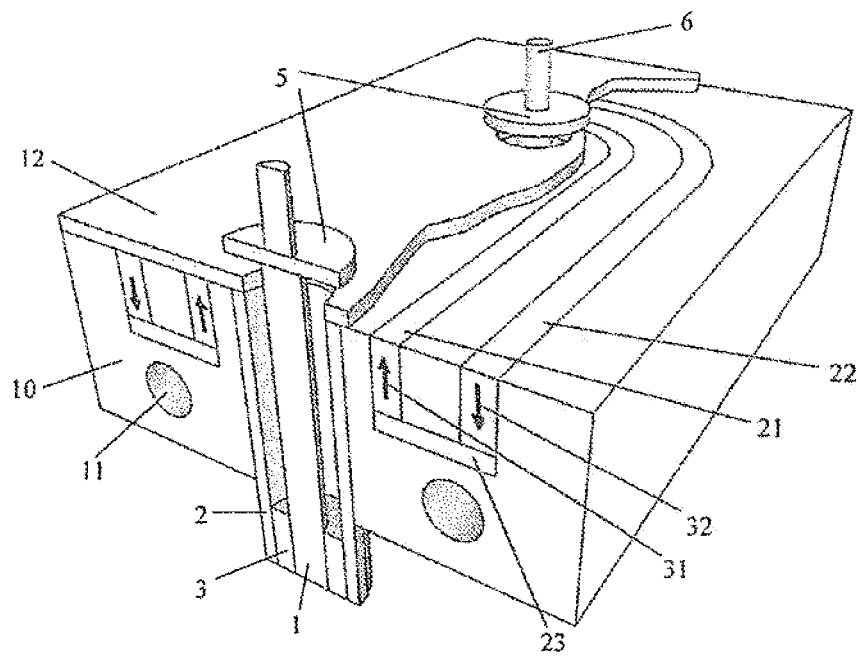

FIG. 8 is a perspective view of a first embodiment of the present invention having a cross-section at the level of a microwave inlet.

Figure 9:
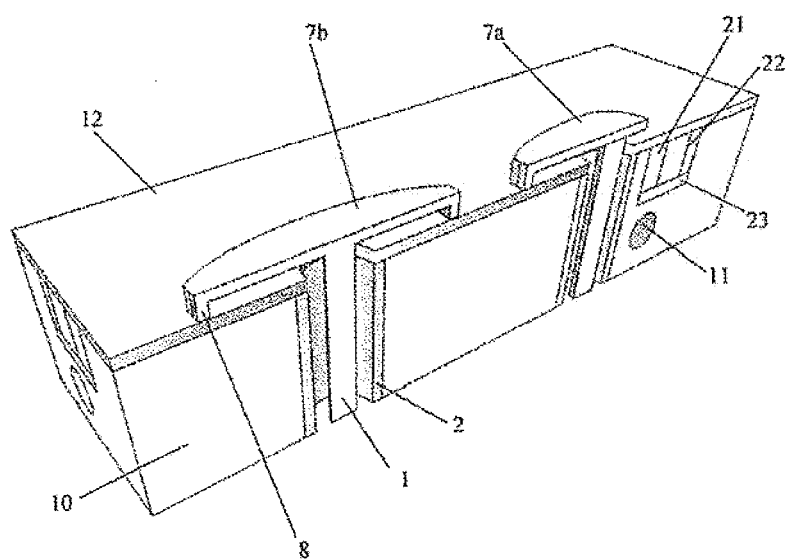

FIG. 9 is a perspective view of a second embodiment of the present invention having a cross-section in the plane of microwave injectors and a second cross-section between two injectors perpendicularly to this plane.

DETAILED DESCRIPTION

Figure 1:
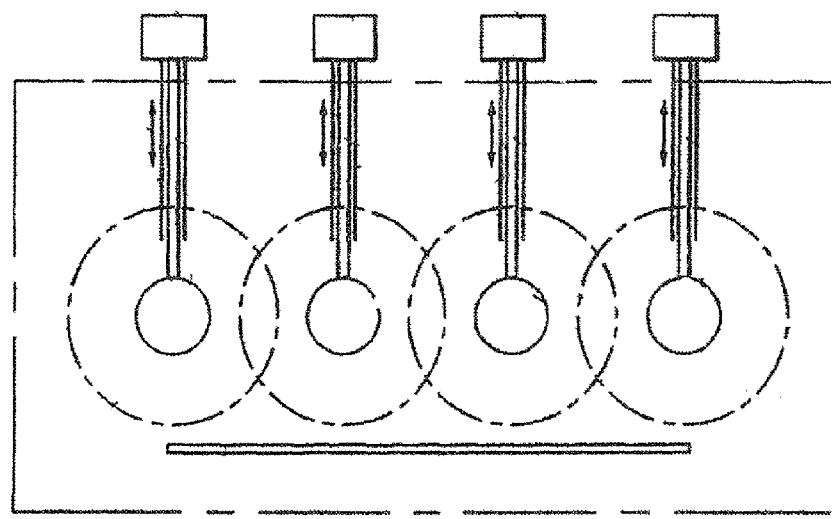
FIG. 1 is a simplified view of the prior art described in patent EP 1075168.
Figure 2:
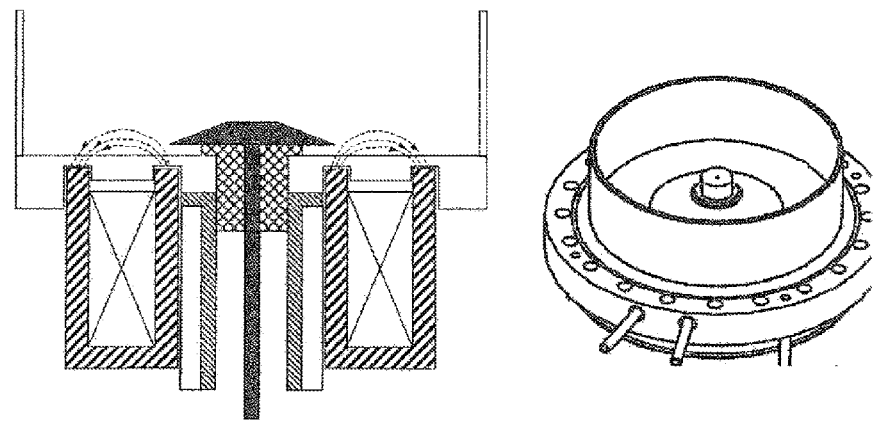
FIG. 2 is a simplified view of the prior art described in patent WO 2008/017304.
Figure 3:
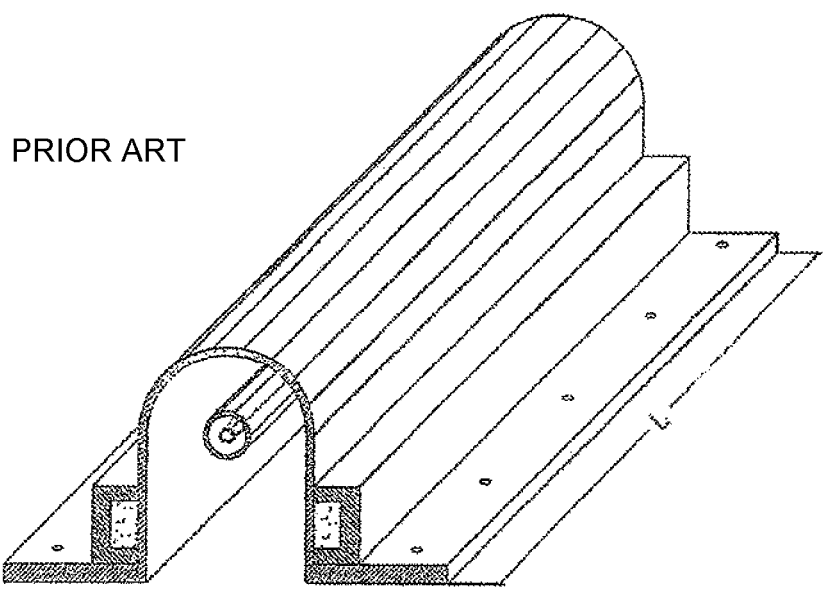
FIG. 3 is a simplified view of the prior art described in patent DE 19812558.
Figure 4:
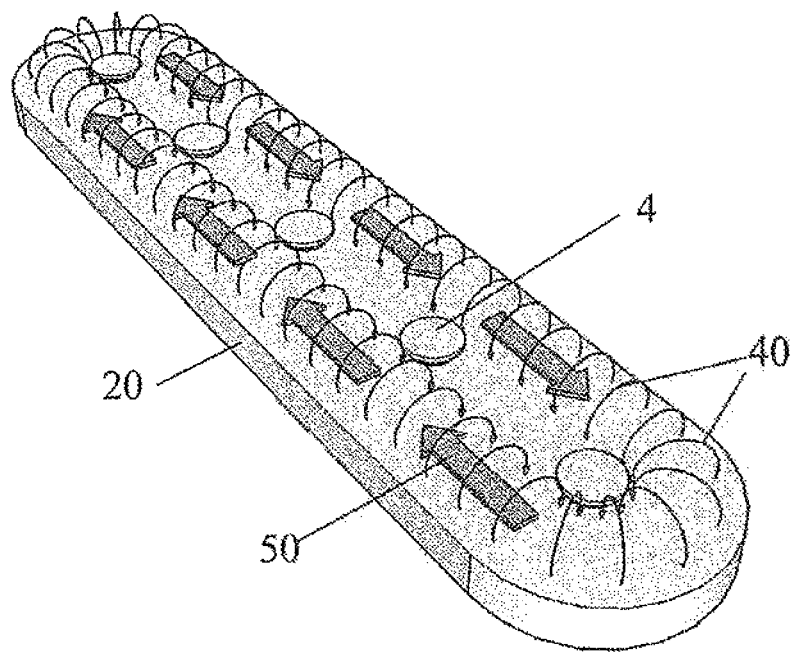
FIG. 4 is a simplified view of the principle of the present invention.

The basic principle of the invention, that is, the elongated magnetic circuit surrounding several microwave injectors, is schematically illustrated in FIGS. 4 and 5.

The magnetic circuit has, in the vicinity of the source surface, two poles of opposite polarity to form a magnetic trap for electrons. The first pole forms a first line (21) surrounding the injection guides (4) of the electromagnetic waves and the second pole forms a second line (22) surrounding this first line.

FIG. 5 shows two possible forms for the magnetic circuit. The first one (FIG. 5A) has the advantage of being easier to form, but the ECR area is tangential to the injectors in the linear portion. The second form (FIG. 5B) attempts to optimize the ECR volume close to the injectors.

By setting the relative force of the 2 poles of the magnetic structure, it is possible to influence the plasma flow towards the substrates to be treated. For example, by reinforcing the external pole of circuit (22), the 2 plasma strips will be made to converge from the linear portion into the space in front of the source, which enables to increase the part treatment speed in this location. This is useful to decrease lateral losses if the walls of the vacuum enclosure are close. If, however, the inner pole of the circuit (21) is reinforced, the 2 plasma strips laterally shift away from each other. In certain cases, this may be an advantage such as, for example, for a cylindrical treatment surface for which 2 treatment areas tangent to the cylinder surface can thus be created.

Wave injectors are formed by coaxial guides having their central conductor ending in an antenna.

The invention provides two ways to optimize the shape of antennas.

The following numerical examples are given for a plasma source comprising coaxial waveguides with external conductors having inner diameters of 17 mm and with inner conductors having external diameters of 8 mm.

In a first embodiment, illustrated in FIG. 6, the central conductor (1) first widens in a disk (5). Such a disk has a greater diameter than the opening of the waveguide (1)-(2) which enables to protect the inside of the guide from a possible deposition and to bring the wave as close as possible to the ECR area. Its edge is indeed located a few millimeters away from the ECR area. The disk has thickness of a few millimeters, typically ranging between 1 and 5 m, and forms with the source surface a slot of a few millimeters, advantageously between 2 and 5 mm. This disk is topped with a rod (6) which continues the central conductor (1). This rod has a length ranging between $\lambda/8$ and $\lambda/2$, $\lambda$ being the microwave wavelength. The exact length depends on the disk diameter and on the shape of the ECR area. The antenna is optimized by adjusting the length of this rod. For example, in an embodiment with a disk having a 25-mm diameter, the optimal length for the rod ranges between 30 and 35 mm for a 122.4-mm wavelength (2.45 GHz). Thus, despite its symmetry of revolution, this antenna generates a good coupling of the microwave field to the plasma. The function of the rod is to match the impedance of vacuum to that of the plasma.

In a second embodiment, the central conductor ends in a plate (7) having a thickness of a few millimeters which, this time, has no symmetry of revolution but is elongated along the longest axis of the magnetic system (FIG. 7A-7B). Widthwise, this plate extends beyond the opening of the waveguide and ends a few millimeters away from the ECR area. Its total length ranges between $\lambda/4$ and $\lambda$. By adjusting this length, it is possible to optimize the coupling towards the plasma. At its ends, the plate is placed in contact (8) with the surface of the source to create a short-circuit, thus avoiding for it to radiate microwaves towards neighboring plates. Such a short-circuit forces the wave to create at this location a node in the electric field. The wave reflects and returns to the injection point. The distance between the injection point and the return to earth sets the phase of the reflected wave when it reaches the injection point. By modifying this distance, it is possible to adjust this phase to that of the wave reflected by the plasma. A "natural" solution seems to be that where the total length of the plate is $\lambda/2$, that is, 61 mm for a 2.45-GHz frequency, for which length a stationary wave forms between the 2 ends. In a real case, it has however been found that such a theoretical length is not optimal for the plasma efficiency and that the length has to be increased by approximately 10% to obtain satisfactory results.

The plate width may remain the same along the entire length of the plate (FIG. 7A) or decrease as the distance from the injection point increases (FIG. 7B). In a preferred embodiment, the plate width decreases towards its end. For example, for a plate which is 25-mm wide in its middle, the width will only be 10 mm at its ends.

For an injector located inside of a turn of the magnetic circuit, this second antenna shape is modified so that the plate is only elongated in the direction leaving the turn (FIG. 7C). The length of this portion, measured from the center of the central guide, then ranges between $\lambda/8$ and $\lambda/2$. On the turn side, the plate has the shape of a half-disk. In an embodiment, with a half-disk having a 12.5-mm radius, the elongated portion measures 34 mm, still for a $\lambda$ of 122.4 mm (2.45 GHz).

It is possible to combine on a same source several types of antennas to optimize the general performance. It is also possible two combine the two solutions provided by the invention, such as for example the elongated plate topped with a rod.

Reference should be made to FIGS. 8 and 9, which show in cross-section view two embodiments of a plasma source integrating the device according to the invention.

In FIG. 8, the treatment chamber comprises an amagnetic metal body (10) cooled by water circulating in a cooling circuit (11). A housing provided in the body receives the magnetic circuit. In this embodiment, the magnetic system is formed of the first line of magnets (21) of a first polarization (31) and of the second line (22) surrounding the first line and having the opposite polarization (32). Inside of the body (10), the two magnet lines (21) and (22) are connected by a ferromagnetic plate (23). The body (10) and the magnetic system are separated from the plasma by a shield (12). Cylindrical holes are provided in the body (10) and the sheet (12) for the microwave injection, by means of several coaxial guides having their external conductors (2) inserted into the source body in good electric contact therewith. The central conductor of each guide appears in the form of a cylindrical rod (1), centered with respect to the external conductor and extending beyond the shield. A dielectric window (3) is placed inside of the guide several centimeters away from the opening. This offset location guarantees a low fouling of the dielectric by any deposit and especially by a conductive deposit which could prevent the passing of microwaves. The dielectric enables to create a tightness between the inside and the outside of the vacuum treatment enclosure. In this first embodiment, the waveguide opening is covered with a disk (5) which prevents the deposit from penetrating into the waveguide and enables to take the microwaves to the ECR area. The disk (5) is topped with a rod (6) which enables to optimize the coupling with the plasma.

Thus, in an implementation where the circular disk has a 25-mm diameter and a 3-mm thickness, the rod length has been adjusted between 16 and 35 mm for a 2.45-GHz microwave frequency and a 90-W power per antenna. In each configuration, the ease of ignition is observed. The ignition is considered as easy if it requires no modification at the level of the impedance matching devices located on each injection line.

Measurements of the electric current extracted from the plasma and collected by substrates placed 8 cm away from the source and taken to a 20-V voltage have been carried out, as appears from the following table:

|  | Rod length | | | |
| --- | --- | --- | --- | --- |
|  | 16 mm | 20 mm | 30 mm | 35 mm |
| Measured current | 1.37 A | 1.38 A | 1.41 A | 1.41 A |
| Easy ignition | no | yes | yes | yes |

Although the current variation is low due to the fact that the impedance matching has been optimized in each configuration to provide an optimal transfer of the power to the plasma, it is sufficiently significant to enable to determine an optical length located between 30 and 35 mm in this configuration.

In the embodiment illustrated in FIG. 9, the basic design of the treatment chamber is the same. The difference lies in the antennas. In this embodiment, the antenna plates (7a) and (7b) are elongated along the injector axis. Elongation (7a) is asymmetrical with respect to the central conductor (1) for an antenna which is located at one end of the plasma source, at the center of a turn of the magnetic circuit, the elongation only being towards the opposite end. Elongation (7b) is symmetrical with respect to the central conductor for an antenna located in the linear portion of the magnetic circuit. Each elongated portion is terminated by a short-circuit (8) avoiding for the antenna to radiate towards its neighbor. In the present embodiment, the width of the plate decreases as the distance from the central conductor increases (1) and towards the earth return.

Such a configuration has first been tested with antennas for which the distance between the earth return and the central conductor of the waveguide is between 31 and 32 mm, and thus close to $\lambda/4$ (30.6 mm). This has provided an increase of the current by approximately 3% with respect to the first embodiment. When this distance is taken to 34 mm, the current increases by an additional 3%, and thus by 6% with respect to the first embodiment. In both cases, the plate has a 3-mm thickness.

The advantages well appear from the disclosure.

The invention claimed is:

1. A device for generating a plasma having an extension along an axis by electron cyclotron resonance ECR from a gaseous medium and comprising at least two coaxial waveguides each formed of a central conductor and of an external conductor to bring microwaves into a treatment chamber, wherein at least the two waveguides are combined with a magnetic circuit elongated in one direction, said magnetic circuit surrounding the at least two waveguides by creating a magnetic field capable of achieving an ECR condition close to said at least two waveguides, wherein the magnetic circuit has, close to the at least two waveguides, two poles of opposite polarities to form a magnetic trap for electrons, and a first pole of the two poles forms a first line surrounding the at least two waveguides, while a second pole of the two poles forms a second line, surrounding the first line.

2. The device of claim 1, wherein the central conductor of each waveguide is provided with fittings protecting an opening of said waveguide and behaving as antennas.

3. The device of claim 2, wherein the central conductor has a concentric disk of larger diameter than the opening of the waveguide to protect an inside of said waveguide, which is positioned close to an ECR area, and is topped with a rod arranged in coaxial alignment with the central conductor.

4. The device of claim 2, wherein the central conductor is ended by a plate elongated along a longest axis of the magnetic circuit, one end at least of said plate being provided with fittings to be placed in contact with a surface of a source in order to create a short-circuit, a width of the plate being larger than the opening of the waveguide.

5. The device of claim 4, wherein the width of the plate is constant along an entire length of the plate.

6. The device of claim 4, wherein the width of the plate decreases as distance from the central conductor increases, and with respect to said at least one side of said conductor.

7. The device of claim 1, wherein the treatment chamber comprises a body with a cooling circuit, said body comprising a housing for assembly of the elongated magnetic circuit, said circuit comprising a first line of magnets according to a first polarization and a second line of magnets according to an opposite polarization and surrounding the first line, the magnetic circuit surrounds the at least two waveguides assembled in holes formed across a thickness of the body, the first and second lines of magnets are connected by a ferromagnetic plate, the body and the magnetic circuit being separated from the plasma by a shield.

8. The device of claim 7, wherein the central conductor comprises a cylindrical rod centered with respect to the external conductor inserted in the body with a good electric contact, a dielectric window being placed inside of the waveguide under the opening which is covered with a disk topped with a rod to be used as an antenna.

9. The device of claim 1, wherein the central conductor comprises a cylindrical rod centered with respect to the external conductor inserted into the body by forming a good electric contact, a dielectric window being placed inside of the waveguide under the opening, which is covered with an elongated plate along an axis of injectors, said elongation being asymmetrical with respect to the central conductor for a waveguide located at a rounded end of the magnetic circuit, the elongation being only in a direction of an opposite end, symmetrical with respect to the central conductor for a waveguide located in a linear portion of the magnetic circuit, each elongated portion being provided with the fitting used as a short-circuit.

\* \* \* \* \*